United States Patent
Rostaing et al.

(10) Patent No.: US 8,642,359 B2
(45) Date of Patent: Feb. 4, 2014

(54) ELECTROMAGNETIC COUPLING DEVICE OF AN ELECTROMAGNETIC RADIATION DETECTOR

(75) Inventors: Jean-Pierre Rostaing, La Cote Saint Andre (FR); Olivier Billoint, Grenoble (FR); Patrice Ouvrier-Buffet, Saint Jorioz (FR); Patrick Villard, La Tronche (FR)

(73) Assignee: Commissariat a l'Energie Atomique, Paris (FR)

( * ) Notice: Subject to any disclaimer, the term of this patent is extended or adjusted under 35 U.S.C. 154(b) by 630 days.

(21) Appl. No.: 12/443,984

(22) PCT Filed: Oct. 10, 2007

(86) PCT No.: PCT/EP2007/060771
§ 371 (c)(1),
(2), (4) Date: Apr. 2, 2009

(87) PCT Pub. No.: WO2008/043786
PCT Pub. Date: Apr. 17, 2008

(65) Prior Publication Data
US 2010/0010779 A1    Jan. 14, 2010

(30) Foreign Application Priority Data
Oct. 12, 2006   (FR) ..................................... 06 54235

(51) Int. Cl.
*G01R 31/26*   (2006.01)
(52) U.S. Cl.
USPC ............................................. 438/14; 702/189
(58) Field of Classification Search
USPC ............................................. 702/189; 438/14
See application file for complete search history.

(56) References Cited

U.S. PATENT DOCUMENTS

| | | | | | |
|---|---|---|---|---|---|
| 4,431,918 | A | * | 2/1984 | White | 250/338.1 |
| 4,740,824 | A | * | 4/1988 | Yano et al. | 257/444 |
| 4,886,962 | A | * | 12/1989 | Gofuku et al. | 257/53 |
| 6,903,670 | B1 | * | 6/2005 | Lee et al. | 341/118 |
| 2004/0266053 | A1 | | 12/2004 | Varghese | |
| 2009/0321620 | A1 | * | 12/2009 | Hillis et al. | 250/227.23 |

FOREIGN PATENT DOCUMENTS

| | | |
|---|---|---|
| EP | 0 214 408 A2 | 3/1987 |
| EP | 1 102 321 A2 | 5/2001 |
| EP | 1102321 A2 * | 5/2001 |
| EP | 1 122 790 A | 8/2001 |
| FR | 2 888 667 | 1/2007 |
| JP | 05 013748 A | 1/1993 |
| WO | WO 2004/001853 A2 | 12/2003 |
| WO | WO 2004/021402 A2 | 3/2004 |

OTHER PUBLICATIONS

Office Action dated Oct. 23, 2012 (and English translation), received in corresponding European Application No. 07 821 139.8.

* cited by examiner

*Primary Examiner* — Shaun Campbell
(74) *Attorney, Agent, or Firm* — Miles & Stockbridge P.C.

(57) ABSTRACT

An integrated circuit intended to be assembled with an electromagnetic radiation detector, the integrated circuit comprising a device for processing signals stemming from the detector, the processing device being covered with at least one conductive plate for protection against electromagnetic radiation, intended to be placed between said detector and said integrated circuit, said conductive plate including one or more apertures letting through conductive elements providing an electrical connection between the processing device and the detector.

14 Claims, 2 Drawing Sheets

ELECTROMAGNETIC COUPLING DEVICE OF AN ELECTROMAGNETIC RADIATION DETECTOR

CONTINUING DATA

This is a submission pursuant to 35 U.S.C. 154(d)(4) to enter the national stage under 35 U.S.C. 371 for PCT/EP2007/060771 filed Oct. 10, 2007. Priority is claimed under 35 U.S.C. 119(a) and 35 U.S.C. 365(b) to Patent Application FRANCE 06 54235 filed Oct. 12, 2006.

TECHNICAL FIELD

The present invention relates to the field of microelectronics and more particularly to that of electromagnetic radiation detectors associated or assembled with at least one integrated circuit comprising an electronic device for processing signals from the detector.

PRIOR ART

Figure 1:
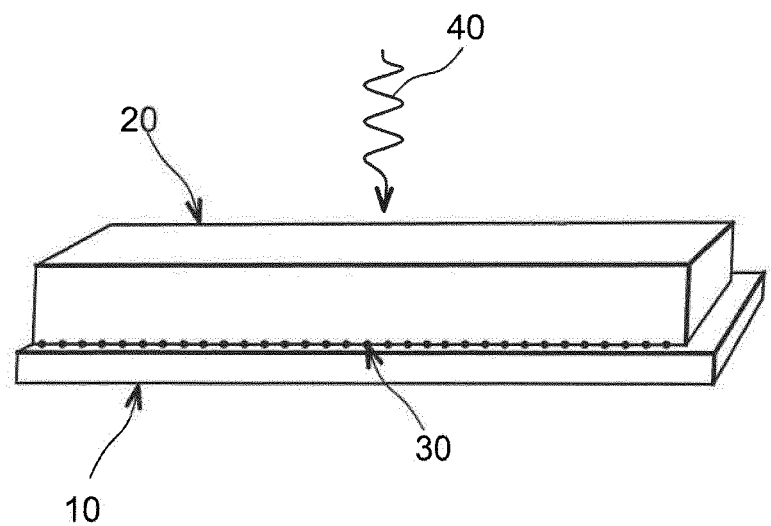

FIG. 1 illustrates an exemplary microelectronic device according to the prior art, comprising an electromagnetic radiation detector 20, connected via metal connections 30 to an electronic circuit 10 for processing signals stemming from the interaction of photons 40 in the material of the detector. In the electronic circuit 10, certain areas corresponding for example to digital stages or to digital components capable of carrying out massive data processing operations, produce electromagnetic perturbations, which may prove to be not negligible relatively to the useful signal stemming from the detector 20 and may possibly be stronger than the useful signal of the detector 20.

DISCUSSION OF THE INVENTION

The invention first of all relates to an integrated circuit, intended to be assembled with an electromagnetic radiation detector, the integrated circuit comprising a device for processing signals stemming from the detector, the processing device being covered with at least one conductive plate, said conductive plate including one or more apertures letting through conductive elements, providing an electric connection between the processing device and the detector.

The conductive plate is notably used as a shield against said electromagnetic radiation.

The conductive plate has a layout with which it may fulfill such a protective role.

The conductive plate may be placed in the upper portion of the integrated circuit. The electromagnetic radiation detector is then placed on the integrated circuit, so that said plate is placed between said circuit and the detector.

According to a possible application of the integrated circuit, the latter may comprise means for biasing said conductive area.

The integrated circuit may comprise in its upper portion, at least one insulating layer in which said conductive elements are placed.

According to a possible application of the integrated circuit, said conductive plate may be placed at the surface of the integrated circuit, each conductive element comprising a connection pad placed at the surface of the integrated circuit.

According to another possible application, said conductive plate may be placed between two insulating layers, said conductive elements comprising conductive vias placed in said apertures of the conductive area.

The integrated circuit may comprise a semiconducting substrate, the signal processing device comprising electric components formed in and above the semiconducting substrate.

According to a possible application of the integrated circuit, at the apertures of the conductive layer, said conductive elements may be separated from said conductive layer by a space provided for allowing capacitive coupling. With this, a test of the integrated circuit may be carried out.

The invention also relates to a microelectronic device comprising an electromagnetic radiation detector assembled and connected with an integrated circuit as defined above.

The invention also relates to a method for testing such an integrated circuit comprising the following steps:
applying a variable voltage on said conductive layer, and
verifying the operation of the signal processing device.

SHORT DESCRIPTION OF THE DRAWINGS

Figure 2:
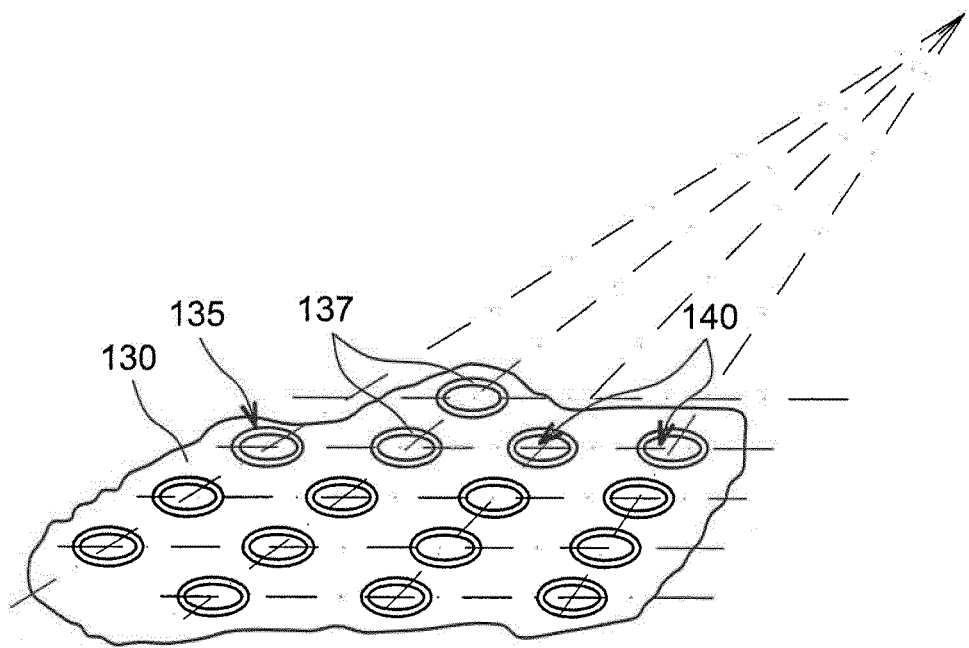
Figure 3A:
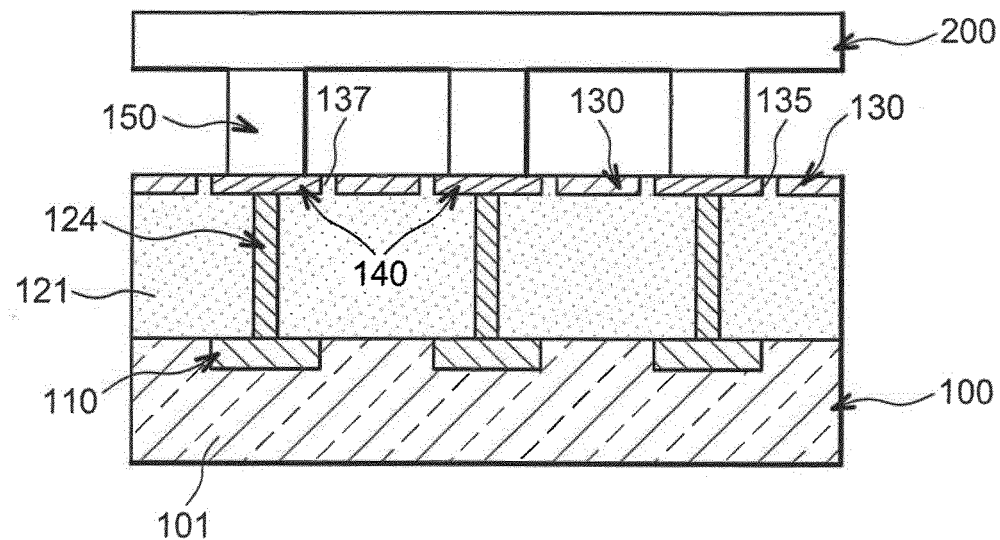
Figure 3B:
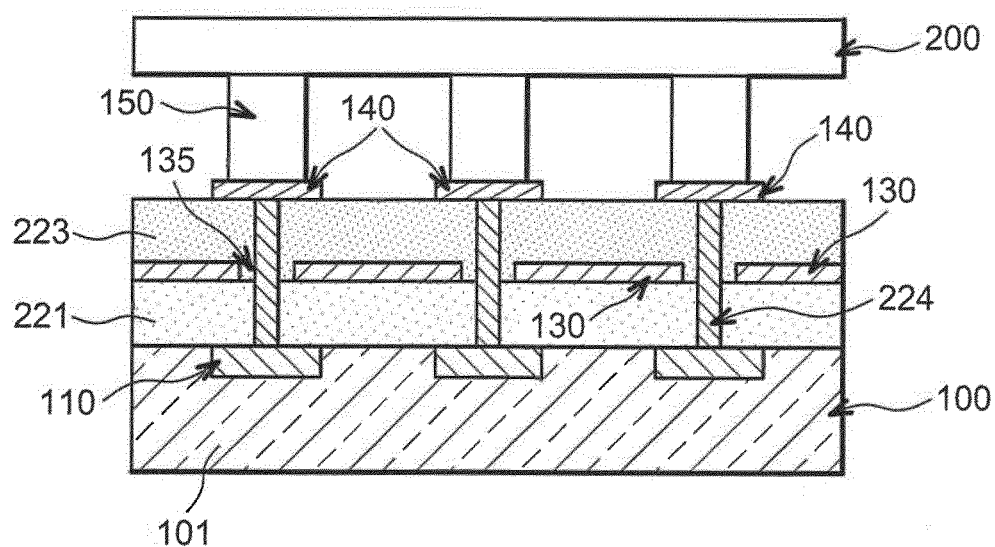

Other objects, characteristics and advantages of the invention will become apparent upon reading the detailed description hereafter, of embodiments of the invention, made as a non-limiting example, with reference to the appended drawings wherein:

FIG. 1 illustrates an electromagnetic radiation detector, assembled and connected with an integrated circuit comprising a device for processing signals from the detector, FIG. 2 illustrates a conductive plate which may be used in a device according to the invention, FIGS. 3A and 3B illustrate, in a sectional view, a first embodiment and a second embodiment of the device according to the invention, respectively.

Identical, similar or equivalent portions of the different figures bear the same numerical references so as to facilitate the passing from one figure to the other.

The different portions illustrated in the figures are not necessarily illustrated according to a uniform scale, in order to make the figures more legible.

DETAILED DISCUSSION OF PARTICULAR EMBODIMENTS

An exemplary device for protecting and testing an integrated circuit according to the invention is illustrated in FIG. 2.

This device comprises an electrically conducting area intended to be placed between an electromagnetic radiation detector and an electronic circuit for processing signals stemming from the detector (not shown in this figure). The conductive area may be connected to electric biasing means (not shown) with which at least one electric potential may be applied onto the conductive area.

The conductive area may be in the form of a layer or a plate 130, based on a first metal, for example aluminium, intended to form a first electrode.

The plate 130 may have a rectangular or square shape, for example with dimensions of the order of 200 µm*200 µm.

The metal layer or plate 130 may consist of a metal currently used for making interconnection networks of an integrated circuit, such as copper or aluminium. In order to fulfil at best its protective role, by absorbing as much as possible electromagnetic radiations emitted by the integrated circuit, the layer or plate 130 may consist of a material having high magnetic permeability, such as a material based on iron, nickel or cobalt. Also, the larger the thickness of the layer or plate, the more it is possible to absorb low frequency electromagnetic radiations.

In the case when the operating frequency of the integrated circuit is of the order of tens or hundreds of MHz, with a metal layer in cobalt or in aluminium of a thickness from 1 to 2 microns, a good portion of the electromagnetic radiations may be absorbed.

In this example, the metal plate 130 is openworked and includes a plurality of apertures 135 in which at least one electrically conducting pad 140 appears respectively. By plate, it is meant that the surface area occupied by the metal layer is larger than the total surface area occupied by the apertures. With this, the plate 130 may at best fulfil its protective role.

The conductive pads 140 located in the apertures may be based on a metal either identical with or different from the first metal, for example aluminium, copper or tungsten.

The conductive pads 140 are laid out so that a space 137, for example of the order of 1 μm, empty or filled with a dielectric material, is provided between each conductive pad 140 and the metal layer 130. The space 137 between each conductive pad 140 and the metal layer 130 is provided sufficiently thin so as to allow capacitive coupling.

According to one possibility, a coupling capacitance of at least 10 fF, for example of the order of 40 fF may be obtained.

In a plane parallel to the plate 130, the conductive pads 140 may respectively have a surface of the order of 625 $\mu m^2$, for example.

The conductive pads may be provided so as to have in a plane parallel to the plate 130, a surface area less than 20% or 10%, preferably 2% of the total surface of the plate.

The conductive pads may have a square or rectangular or orthogonal shape. According to one alternative, cylindrical conductive pads may be provided.

The apertures 135 and the conductive pads 140 may have a regular distribution in the metal layer 130, and for example a matrix layout. The apertures 135 may have a distribution provided so that the spacing between two apertures is at least 5 times larger or at least 10 times larger than the diameter or the critical dimension of the conductive pads 140.

With this, the mutual capacitance between the conductive pads may be set to zero.

With the conductive pads 140, an interconnection may be achieved between an electromagnetic radiation detector 200 and an integrated circuit 100 including a device for processing signals stemming from the detector, as this is described hereafter in connection with FIGS. 3A and 3B.

According to a possible application, the apertures 135 and the conductive pads 140 may have different shapes.

According to a first possible application of the protective means, electric biasing means may be providing in order to apply to the conductive layer 130 a fixed electric potential V relatively to a reference potential of the electronic processing circuit. In this case, the openworked metal layer 130 allows an electromagnetic shield to be formed against perturbations from the integrated circuit 100. This operating mode is particularly of interest when the detector is operating.

According to a second possible application, the electric biasing means may be provided in order to apply to the metal layer 130 a variable potential v. In this case, the metal layer 130 is capable of forming a stimulation electrode for the pads 140 and with it, an amount of charge q=C*v with C being the capacitance between the metal layer 130 forming a first electrode and one of the conductive pads 140 may respectively be applied to the latter. The applied charges on the pads 140 may be identical.

This second possible application may prove to be advantageous as regards the testing and calibration of the electronic processing circuit 100. Each capacitance C may be identical by design. The electrical signals induced in each pad are then identical and known. During a test phase, it is possible to generate signals similar to signals stemming from the detector. Means for testing the processing device may be applied in order to verify whether all the induced signals are detected and whether a correct signal value is measured by the processing device. Such a test may advantageously be carried out prior to the assembly of a radiation detector on an integrated circuit according to the invention.

Moreover, provision may be made for applying a variable potential v on the conductive plate or layer 130, when the detector is operating. Application of an alternating signal on the plate 130 corresponds to a modulation operation on the signals from the detector. With such a modulation, subsequent processing of the signals may be improved by the signal processing device placed on the integrated circuit 100.

FIG. 3A illustrates an exemplary assembly between an electromagnetic radiation detector 200 and an integrated circuit 100 including a device for processing signals from the detector 200. The detector 200 may for example be provided for detecting one of the following radiations: X-rays, gamma rays, infrared, visible radiation. The integrated circuit 100 may for example be an ASIC (Application-Specific Integrated Circuit). The processing device is notably provided for amplifying weak signals originating from the interaction between photons and the material of the detector 200. The integrated circuit 100 may be formed on a semiconducting substrate 101, for example based on silicon, and be provided with a set of electronic components and metal interconnections which may be laid out over several levels and among which appear contacts 110 placed at the surface of the substrate 101. In FIG. 3A, the substrate 101 is covered with an insulating layer 121, based on a dielectric material such as for example $SiO_2$, and in which conductive elements such as conductive vias 124 are placed, for example connected to a contact 110 placed at the surface of the substrate 101. The conductive vias 124 inserted into the insulating layer 121 are also respectively connected to at least one connection pad 140 located at the surface of the integrated circuit on the insulating layer 121. A metal contact 150 is placed on each connection pad 140 in order to connect the detector 200 to the integrated circuit. Means for protecting the detector 200 from electromagnetic perturbations from the electronic circuit 100 are provided. These means comprise an openworked conductive layer 130 including a plurality of apertures 135 in which respectively appears at least one connection pad 140 to which at least one contact of the detector 200 and at least one contact of the integrated circuit 100 are connected. The conductive pads 140 and the conductive layer 130 are located in a same plane which is parallel to the main plane of the substrate 101. The connection pads 140 are separated from the layer 130 by a thickness of dielectric material.

FIG. 3B illustrates an alternative of the exemplary embodiment described earlier, for which the connection pads 140 to which at least one contact of the detector 200 is connected, are located in a plane different from that of the openworked metal layer 130. In this alternative embodiment, the insulating layer 121 is replaced with a first insulating layer 221 and second insulating layer 223 stacked over each other, the conductive plate 130 being placed on the first insulating layer 221. Conductive vias 224 are placed in said apertures 135 of the conductive plate 130. In this exemplary embodiment, the conductive vias 135 connect the connection pads 140 placed at the surface of the integrated circuit to the contacts 110 places at the surface of the substrate 100

It will be noted that the electrical connections between the connection pads 140 and the processing device may have any shape other than the purely <<vertical>> one illustrated in FIGS. 3A and 4A. Further, the electric connections are not necessarily connected to a contact placed on the substrate 100. They may for example be connected to a transistor gate.

Electrical biasing means may be provided for applying a fixed V or variable v electric potential to the metal layer 130. According to a possible application, the means for biasing the conductive layer 130 are placed in the integrated circuit. These biasing means for example use the general power supply network of the integrated circuit.

According to one alternative, biasing means outside the integrated circuit may also be used. These external biasing means may be used for example when it is desired to test the signal processing device before assembling the detector 200 on the integrated circuit 100. Prior to assembling the detector and the integrated circuit, a test device for example of the BIST (BIST or Built-In Self Test>>type placed on the integrated circuit may also be used. A test prior to assembling allows the number of faulty integrated circuit/detector devices to be reduced.

The invention claimed is:

1. An integrated circuit, adapted to be assembled with an electromagnetic radiation detector, the integrated circuit comprising:
   a device for processing signals from the detector, the processing device being disposed in a first plane below at least one protective conductive plate constructed to prevent electromagnetic radiation generated by said processing device from being detected by said detector, said conductive plate being disposed in a second plane above said processing device and being placed between and below said detector and said processing device and including one or more apertures constructed to allow conductive elements to be disposed therethrough providing an electrical connection between the processing device and the detector,
   wherein a surface area occupied by said conductive plate is larger than a total surface area occupied by said apertures,
   wherein the apertures are arranged such that said conductive elements are separated from said conductive plate by an empty space or a space filled with dielectric material, and
   wherein said conductive plate and said detector are separated by an empty space or a space filled with dielectric material.

2. The integrated circuit according to claim 1, further comprising means for biasing said conductive plate.

3. The integrated circuit according to claim 1, wherein said upper portion of the integrated circuit comprises at least one insulating layer in which said conductive elements are placed.

4. The integrated circuit according to claim 1, wherein said conductive plate is placed at a surface of the integrated circuit, each conductive element comprising a connection pad placed at the surface of the integrated circuit.

5. The integrated circuit according to claim 1, wherein said conductive plate is placed between two insulating layers, said conductive elements comprising conductive vias located in said apertures of the conductive plate.

6. The integrated circuit according to claim 1, further comprising:
   a semiconducting substrate,
   wherein the processing device comprises electrical components formed in and above the semiconducting substrate.

7. The integrated circuit according to claim 1, wherein said space is provided sufficiently small in order to allow capacitive coupling between the conductive elements and the conductive plate.

8. The integrated circuit according to claim 7, wherein said apertures and portions of conductive elements placed in said apertures have substantially cylindrical shapes.

9. A microelectronic device comprising an assembled electromagnetic radiation detector connected to an integrated circuit according to claim 1.

10. A method for testing an integrated circuit comprising a device for processing signals from a radiation detector, the processing device being covered with at least one protective conductive plate protecting against electromagnetic radiation, said conductive plate being placed between said detector and said processing device and including one or more apertures constructed to allow conductive elements to be disposed therethrough providing an electrical connection between the processing device and the detector, wherein, at the apertures of the conductive plate, the conductive elements are separated from the conductive plate by a space provided sufficiently small in order to allow capacitive coupling between the conductive elements and the conductive plate, and wherein the apertures and the portions of conductive elements placed in these apertures have substantially cylindrical shapes,
   the method comprising the following steps:
      applying a variable voltage on said conductive plate, and verifying the operation of the processing device,
   wherein a surface area occupied by said conductive plate is larger than a total surface area occupied by said apertures,
   wherein the apertures are arranged such that said conductive elements are separated from said conductive plate by an empty space or a space filled with dielectric material,
   wherein said detector is disposed in a plane which is above said processing device,
   wherein said conductive plate is constructed to prevent electromagnetic radiation generated by said processing device from being detected by said detector, and
   wherein said conductive plate and said detector are separated by an empty space or a space filled with dielectric material.

11. A method for detecting electromagnetic radiation using a device for processing signals from a radiation detector, the processing device being covered with at least one protective conductive plate protecting against electromagnetic radiation, said conductive plate being placed between said detector and said processing device and including one or more apertures constructed to allow conductive elements to be disposed therethrough providing an electrical connection between the processing device and the detector,
   the method comprising:
      applying a fixed potential on said conductive plate while operating the radiation detector,
   wherein a surface area occupied by said conductive plate is larger than a total surface area occupied by said apertures,
   wherein the apertures are arranged such that said conductive elements are separated from said conductive plate by an empty space or a space filled with dielectric material,
   wherein said detector is disposed in a plane which is above said processing device,
   wherein said conductive plate is constructed to prevent electromagnetic radiation generated by said processing device from being detected by said detector, and wherein said conductive plate and said detector are separated by an empty space or a space filled with dielectric material.

12. A method for detecting electromagnetic radiation using a device for processing signals from a radiation detector, the processing device being covered with at least one protective conductive plate protecting against electromagnetic radiation, said conductive plate being placed between said detector and said processing device and including one or more apertures constructed to allow conductive elements to be disposed therethrough providing an electrical connection between the processing device and the detector, the method comprising:

applying a variable potential on said conductive plate while operating the radiation detector in order to modulate electrical signals delivered by the radiation detector, wherein a surface area occupied by said conductive plate is larger than a total surface area occupied by said apertures, wherein the apertures are arranged such that said conductive elements are separated from said conductive plate by an empty space or a space filled with dielectric material, wherein said detector is disposed in a plane which is above said processing device, wherein said conductive plate is constructed to prevent electromagnetic radiation generated by said processing device from being detected by said detector, and wherein said conductive plate and said detector are separated by an empty space or a space filled with dielectric material.

13. The integrated circuit according to claim 1, wherein said apertures are arranged such that a spacing between any two apertures is at least 5 times larger than a diameter of the conductive elements.

14. A device comprising:

an electromagnetic radiation detector operatively coupled to an integrated circuit which is configured to process signals received from the electromagnetic radiation detector, a plurality of contact pads connecting said electromagnetic radiation detector and said integrated circuit; and a conductive plate disposed between said radiation detector and said integrated circuit, said plate being placed below said radiation detector, wherein said conductive plate includes one or more apertures constructed to allow said conductive pads to be disposed therethrough, so as to protect said detector from electromagnetic perturbations generated within said integrated circuit, wherein a surface area occupied by said conductive plate is larger than a total surface area of said apertures, and wherein said conductive plate is separated from said pads and said radiation detector by an empty space or a space filled with dielectric material.

* * * * *